(12) United States Patent
Fukuda et al.

(10) Patent No.: US 9,605,200 B2
(45) Date of Patent: Mar. 28, 2017

(54) DEEP-RED LIGHT-EMITTING MAGNESIUM FLUORO-GERMANATE FLUOROESCENT BODY AND METHOD FOR PRODUCING SAME

(71) Applicant: UBE MATERIAL INDUSTRIES, LTD., Ube-shi, Yamaguchi (JP)

(72) Inventors: Kouichi Fukuda, Ube (JP); Rika Nogita, Ube (JP); Jin Amagai, Ube (JP); Toru Inagaki, Ube (JP)

(73) Assignees: UBE MATERIAL INDUSTRIES, LTD., Ube-Shi, Yamaguchi (JP); UBE INDUSTRIES, LTD., Ube-Shi, Yamaguchi (JP)

( * ) Notice: Subject to any disclaimer, the term of this patent is extended or adjusted under 35 U.S.C. 154(b) by 113 days.

(21) Appl. No.: 14/387,910

(22) PCT Filed: Mar. 26, 2013

(86) PCT No.: PCT/JP2013/058815
§ 371 (c)(1),
(2) Date: Sep. 25, 2014

(87) PCT Pub. No.: WO2013/146790
PCT Pub. Date: Oct. 3, 2013

(65) Prior Publication Data
US 2015/0041843 A1    Feb. 12, 2015

(30) Foreign Application Priority Data
Mar. 26, 2012    (JP) .................. 2012-069784

(51) Int. Cl.
*H01L 33/50* (2010.01)
*C09K 11/66* (2006.01)

(52) U.S. Cl.
CPC .......... *C09K 11/665* (2013.01); *C09K 11/663* (2013.01); *H01L 33/502* (2013.01); *H01L 2224/48091* (2013.01); *H01L 2224/73265* (2013.01)

(58) Field of Classification Search
USPC ................ 257/13, 98; 252/301.4 F; 423/464
IPC ................ C09K 11/663,11/665; H01L 33/502, 2224/48091, 2224/73265, 2924/00014
See application file for complete search history.

(56) References Cited

U.S. PATENT DOCUMENTS

2006/0027781 A1*  2/2006  Dong .................. C09K 11/592
                                                                  252/62.52

\* cited by examiner

*Primary Examiner* — Hrayr A Sayadian
(74) *Attorney, Agent, or Firm* — Nixon Peabody LLP; Jeffrey L. Costellia

(57) ABSTRACT

The deep red light-emitting magnesium fluorogermanate phosphor prepared by calcining a mixture comprising a fine magnesium oxide powder having a BET specific surface area in the range of 5-200 m²/g, a fluorine compound, a germanium compound and a manganese compound gives a light emission having a maximum peak of increased strength in the wavelength region of 640-680 nm upon excitation with a light having a wavelength of 400 nm.

3 Claims, 1 Drawing Sheet

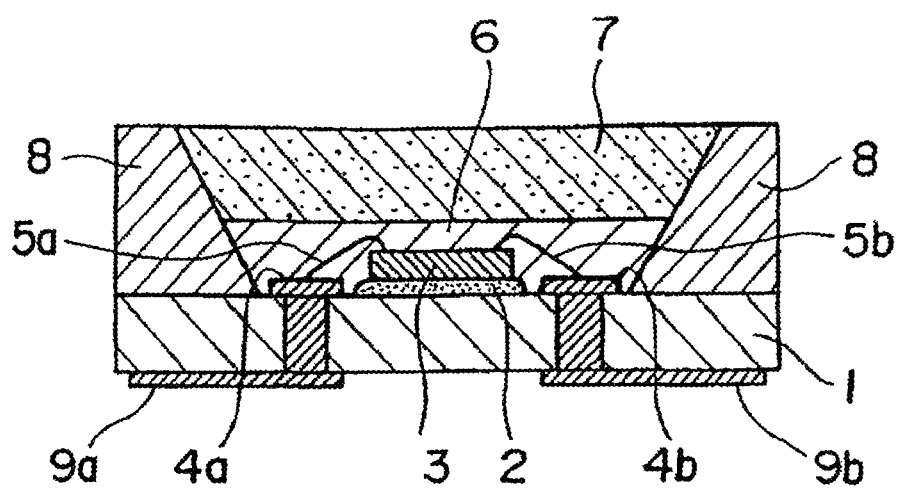

001
DEEP-RED LIGHT-EMITTING MAGNESIUM FLUORO-GERMANATE FLUOROESCENT BODY AND METHOD FOR PRODUCING SAME

FIELD OF THE INVENTION

The present invention relates to a deep red light-emitting magnesium fluorogermanate phosphor and a method for producing the same. The invention further relates to a light-emitting device employing the deep red light-emitting magnesium fluorogermanate phosphor as the red light-emitting source.

BACKGROUND OF THE INVENTION

The magnesium fluorogermanate phosphor having the formula of $3.5MgO.0.5MgF_2.GeO_2:Mn^{4+}$ is known as a deep red light-emitting phosphor as is described in "Phosphor Handbook" (edited by Phosphor Study Society, published by Ohm Corporation, Dec. 25, 1987, page 19).

JP 2008-202044 A describes a deep red light-emitting magnesium fluorogermanate phosphor having the following formula:

in which k is a real number of 2.8 to 5; x is a real number of 0.1 to 0.7; y is a real number of 0.005 to 0.015; and A is Ca, Sr, Ba, Zn or a mixture of these elements.

This patent publication describes a method for producing the above-mentioned phosphor which comprises steps of preparing a homogeneous powdery mixture comprising magnesium oxide, a metal fluoride, germanium oxide and a manganese precursor at a molar ratio of (k−x):x:1:y; calcining the powdery mixture by heating it at 1,000 to 1,200° C. for 4 to 9 hours, and washing and filtering the calcined mixture. It is noted, however, that the publication is silent with respect to details of the magnesium oxide which is employed as the magnesium source. It is also noted that the publication indicates the use of the above-mentioned phosphor as a red light-emitting source for an LED or a fluorescent lamp in which a ultraviolet light source or a blue light-emitting source is utilized.

JP 2011-6501 A describes that a magnesium fluorogermanate phosphor having the formula of $3.5MgO.0.5MgF_2.GeO_2:Mn^{4+}$ can be modified to vary the ratio of its constitutional elements or to partly replace the constitutional elements with other elements, to give a deep red light-emitting phosphor showing increased efficiency of emission produced when it is excited with a light of the near ultraviolet region or visible region, that is a light in the wavelength region of 350 to 500 nm.

This publication further describes a deep red light-emitting phosphor having a modified ratio of the constitutional elements which is represented by the following formula:

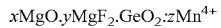

in which x, y and z satisfy the conditions of $1.5<x\leq4$, $0.5<y\leq2$, $0<z\leq0.1$, and $y<x$.

The above-mentioned publication further describes a deep red light-emitting magnesium fluorogermanate phosphor having been modified by replacing portions of the constitutional elements with other elements which is represented by the following formula:

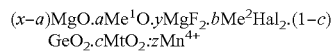

in which x, y, z, a, b and c satisfy the conditions of $1.5<x\leq4$, $0<y\leq2$, $0<z\leq0.1$, $0<a\leq1.5$, $0<b\leq2$, $0<c<0.5$; each of $Me^1$ and $Me^2$ is at least one of Ca, Sr, Ba and Zn, Hal is at least one of F and Cl; and Mt is at least one of Ti, Sn and Zr.

It is noted, however, that this publication does not describe a general description on processes for preparing the above-mentioned phosphor. In the working examples, the phosphor is prepared by employing magnesium carbonate as the magnesium oxide source. The publication further describes the use of the phosphor as the red light-emitting source for a light-emitting diode(LED).

SUMMARY OF THE INVENTION

As is described in the above-mentioned patent publications, the deep red light-emitting magnesium fluorogermanate phosphor has been studied for increasing the strength of emission produced upon excitation with a light of a wavelength in the near ultraviolet region, by varying a ratio of the constitutional elements or replacing a portion or portions of the constitutional elements. However, there are no publications reporting studies for increasing the emission strength of the deep red light-emitting magnesium fluorogermanate phosphor from the viewpoints of its preparation method.

Accordingly, it is an object of the present invention to provide an industrially employable method for producing a deep red light-emitting magnesium fluorogermanate phosphor giving an increased emission strength when it is excited with a light in the near ultraviolet region.

It is another object of the invention to provide a deep red light-emitting magnesium fluorogermanate phosphor giving an increased emission strength when it is excited with a light in the near ultraviolet region, and a light-emitting device containing the above-mentioned phosphor as the red light-emitting source.

The present inventors have found that a deep-red light-emitting magnesium fluorogermanate phosphor giving a light emission having a maximum peak in the wavelength region of 640-680 nm upon excitation with a light having a wavelength of 400 nm which is prepared by calcining a mixture comprising magnesium oxide, a fluorine compound, a germanium compound and a manganese compound gives an emission of increased strength upon excitation with a light having a wavelength of 400 nm, if the magnesium oxide employed is in the form of fine powder having a BET specific surface area in the range of 5-200 $m^2/g$.

Accordingly, there is provided by the invention a deep-red light-emitting magnesium fluorogermanate phosphor giving a light emission having a maximum peak in the wavelength region of 640-680 nm upon excitation with a light having a wavelength of 400 nm which is prepared by calcining a mixture comprising magnesium oxide, a fluorine compound, a germanium compound and a manganese compound, wherein the magnesium oxide is in the form of fine powder having a BET specific surface area in the range of 5-200 $m^2/g$.

Preferred embodiments of the deep-red light-emitting magnesium fluorogermanate phosphor are described below.

(1) The deep-red light-emitting magnesium fluorogermanate phosphor shows a maximum X-ray diffraction peak in the range of 35.2 to 36.0 degree in terms of a diffraction angle 2θ determined by means of CuKα ray having an incident angle of θ.

(2) The fine magnesium oxide powder comprises primary particles in the form of cubic.

(3) The fine magnesium oxide powder has a purity of at least 99.9 wt. %.

(4) The fine magnesium oxide powder has been prepared by bringing magnesium vapor into contact with oxygen in gaseous phase whereby oxidizing the magnesium vapor.

(5) The deep-red light-emitting magnesium fluorogermanate phosphor is represented by the following formula (I):

$$xMgO.yAF_2.GeO_2:zMn^{4+} \qquad (I)$$

in which A is at least one element selected from the group consisting of Mg, Ca, Sr, Ba and Zn; x is a number in the range of 1.5 to 4.5; y is a number in the range of 0.050 to 2.5, and z is a number in the range of 0.0010 to 0.10, particularly in the range of 0.0050 to 0.040.

(6) The deep-red light-emitting magnesium fluorogermanate phosphor is used in a light-emitting device comprising a light-emitting semiconductor element and a red light-emitting phosphor excited with the light produced by the semiconductor element to emit a red light.

There is further provided by the invention a method for producing a deep-red light-emitting magnesium fluorogermanate phosphor giving a light emission having a maximum peak in the wavelength region of 640-680 nm upon excitation with a light having a wavelength of 400 nm, which is prepared by calcining a mixture comprising magnesium oxide, a fluorine compound, a germanium compound and a manganese compound, wherein the magnesium oxide is in the form of a fine powder having a BET specific surface area in the range of 5-200 m$^2$/g.

Preferred embodiments of the above-mentioned method for producing a deep-red light-emitting magnesium fluorogermanate phosphor are described below.

(1) The deep-red light-emitting magnesium fluorogermanate phosphor shows a maximum X-ray diffraction peak in the region of 35.2 to 36.0 degree in terms of a diffraction angle 2θ determined by means of CuKα ray having an incident angle of θ.

(2) The fine magnesium oxide powder comprises primary particles in the form of cubic.

(3) The fine magnesium oxide powder has a purity of at least 99.9 wt. %.

(4) The fine magnesium oxide powder has been prepared by bringing magnesium vapor into contact with oxygen in gaseous phase whereby oxidizing the magnesium vapor.

There is furthermore provided by the invention a light-emitting device comprising a light-emitting semi-conductor element emitting a light in the wavelength region of 350 to 430 nm and the above-mentioned deep red light-emitting magnesium fluorogermanate phosphor of the invention.

There is still furthermore provided by the invention a light-emitting device comprising a light-emitting semiconductor device emitting a light in the wavelength region of 350 to 430 nm, the deep red light-emitting magnesium fluorogermanate phosphor of the invention, a blue light-emitting phosphor emitting upon excitation with a light emitted by the semiconductor element, and a green light-emitting phosphor emitting upon excitation with a light emitted by the semiconductor element.

There is still further provided by the invention a light-emitting device comprising a blue light-emitting semiconductor device, the deep red light-emitting magnesium fluorogermanate phosphor of the invention, and a green light-emitting phosphor emitting upon excitation with a light emitted by the semiconductor element.

EFFECTS OF THE INVENTION

The deep red light-emitting magnesium fluorogermanate phosphor of the invention gives an emission of increased strength. Therefore, the phosphor of the invention is favorably employable as a red light-emitting source to be placed in various light-emitting devices such as a white light-emitting LED and a fluorescent lamp.

BRIEF DESCRIPTION OF THE DRAWING

FIGURE illustrates a section of a light-emitting device (white light-emitting LED) according to the invention.

EMBODIMENTS FOR PERFORMING THE INVENTION

The deep red light-emitting magnesium fluorogermanate phosphor of the invention is obtainable by calcining a mixture comprising magnesium oxide, a fluorine compound, a germanium compound and a manganese compound. In the invention, magnesium oxide used as one of the starting materials is in the form of a fine powder having a BET specific surface area in the range of 5 to 200 m$^2$/g, preferably in the range of 5 to 100 m$^2$/g. It is preferred that the fine magnesium oxide powder comprises cubic primary particles in an amount of at least 80% in terms of a number average of the primary particles. The fine magnesium oxide powder preferably has a purity of 99.9% (wt. %) or higher, more preferably 99.95% or higher. Such fine magnesium oxide powder can be prepared by a gas phase preparation method. The gas phase preparation method is already known and can be performed by bringing a magnesium vapor into contact with oxygen in a gaseous phase, whereby oxidizing magnesium to form a fine magnesium oxide powder.

In the invention, there are no specific limitations with respect to other starting materials than the magnesium oxide. Examples of the fluorine compounds include magnesium fluoride, calcium fluoride, strontium fluoride, barium fluoride, and zinc fluoride. These fluorine compounds can be used alone or in combination. The fluorine compound preferably has a specific surface area in the range of 0.01 to 50 m$^2$/g and a purity of 98% or higher. Examples of the germanium compounds include germanium oxide, germanium bromide, germanium iodide and germanium alkoxide. Germanium oxide is preferred. The germanium compound preferably has a specific surface area in the range of 0.01 to 50 m$^2$/g and a purity of 99% or higher. The manganese compounds preferably are compounds of manganese of 2-4 valent manganese. Examples of the manganese compounds include manganese carbonate, manganese sulfate, manganese nitrate and manganese oxides (MnO, Mn$_3$O$_4$, Mn$_2$O$_3$, MnO$_2$). The manganese compound preferably has a specific surface area in the range of 0.01 to 50 m$^2$/g and a purity of 99% or higher.

The mixture of magnesium oxide (MgO), fluorine compound (AF$_2$), germanium compound (GeX) and manganese compound (MnX) preferably comprises these compound in a molar ratio of 1.5-4.5:0.050-2.5:1:0.0010-0.10, more preferably 3.0-4.3:0.10-1.0:1:0.0050-0.040 in terms of MgO:AF$_2$:GeX:MnX.

There are no specific limitations with respect to the mixing procedure, and either of the dry mixing procedure or wet mixing procedure can be employed. For the wet mixing procedure, the solvent preferably is water, an alcohol or their mixture. The mixing apparatus can be a stirring mixer, a ball mill, or a locking mill.

The mixture of the stating compounds is then calcined to produce a deep red light-emitting magnesium fluorogermanate phosphor. The calcination can be performed at a temperature of 1,000 to 1,300° C., preferably at a temperature of 1,050 to 1,250° C. The calcination is preferably performed in an environmental atmosphere. The calcination can be performed for 1 to 100 hours, preferably 1 to 30 hours. The calcination can be performed twice or more.

The calcined product preferably is a deep red light-emitting magnesium fluorogermanate phosphor having the following formula (I):

$$xMgO.yAF_2.GeO_2:zMn^{4+} \qquad (I)$$

in which A is at least one element selected from the group consisting of Mg, Ca, Sr, Ba and Zn; x is a number in the range of 1.5 to 4.5, preferably 3.0 to 4.3; y is a number in the range of 0.050 to 2.5, preferably 0.10 to 1.0, and z is a number in the range of 0.0010 to 0.10, preferably 0.0050 to 0.040.

The calcined product can be ascertained as the deep red light-emitting magnesium fluorogermanate phosphor from its emission spectrum or X-ray diffraction pattern. In more detail, the deep red light-emitting magnesium fluorogermanate phosphor generally gives a maximum peak in the wavelength region of 640-680 nm in its emission spectrum when it is excited with a light of a wavelength of 400 nm. In addition, the deep red light-emitting magnesium fluorogermanate phosphor generally gives a maximum X-ray diffraction peak in the region of 35.2 to 36.0 degree in terms of a diffraction angle 2θ determined by means of CuKα ray having an incident angle of θ.

The reason why the deep red light-emitting magnesium fluorogermanate phosphor produced by the use of a magnesium oxide having a larger BET specific surface area gives an emission of increased strength is assumed as follows: The use of fine magnesium oxide powder having a large BET specific surface area (hence, having increased reactivity) as magnesium oxide of the major starting material enables the calcination reaction to proceed uniformly and hence gives a uniformly calcined product. Moreover, the resulting calcined product has a high purity with a little amount of contamination. It has been noted that only a small amount of the starting magnesium oxide particles remain in the resulting deep red light-emitting magnesium flourogermanate phosphor of the invention. This has been ascertained from an X-ray diffraction pattern of the resulting phosphor. In more detail, the deep red light-emitting magnesium fluorogermanate phosphor of the invention gives an X-ray diffraction pattern in which a ratio of the height of X-ray diffraction peak assigned to magnesium oxide to the height of X-ray diffraction peak assigned to the phosphor generally is 0.6 or less in terms of a ratio of former to latter.

The resulting phosphor of the invention gives a maximum X-ray diffraction peak in the region of 35.2 to 36.0 degree in terms of a diffraction angle 2θ, while magnesium oxide gives a maximum X-ray diffraction peak in the region 42.7 to 43.2 degree in terms of a diffraction angle 2θ.

The deep red light-emitting magnesium fluorogermanate phosphor of the invention is favorably employable in a light-emitting device comprising a light-emitting semiconductor element and a red light-emitting phosphor which emits a red light upon excitation with the light produced by the semiconductor element.

The light-emitting device utilizing the deep red light-emitting magnesium fluorogermanate phosphor of the invention is further described below referring to a white light-emitting LED illustrated in the attached FIGURE.

The attached FIGURE illustrates a section of a white light-emitting LED employing the deep red light-emitting magnesium fluorogermanate phosphor of the invention. In FIGURE, a white light-emitting LED comprises a substrate 1, a light-emitting semiconductor element 3 fixed onto the substrate 1 by means of an adhesive 2, a pair of electrodes 4a,4b formed on the substrate 1, lead wires 5a,5b electrically bridging the semiconductor element 3 and the electrodes 4a,4b, a resin layer 6 covering the semiconductor element 3, a phosphor layer 7 placed on the resin layer 6, a light reflective material 8 covering the side faces of the resin layer 6 and phosphor layer 7, and electroconductive wires 9a,9b for electrically connecting the electrodes 4a,4b and outer power source (not shown).

It is preferred that the substrate 1 has high insulating property and high thermal conductive property. Examples of the substrates include substrates made of ceramics such as alumina or aluminum nitride and substrates made of resin in which inorganic particles such as metal oxide particles or glass particles are dispersed. The light-emitting semiconductor element 3 preferably emits a light in the wavelength region of 350 to 430 nm when electric energy is applied. Examples of the semiconductor elements include a light emitting AlGaN semiconductor element. The resin layer 6 is formed of transparent resin. Examples of the transparent resins employable for forming the resin layer include epoxy resin and silicone resin.

The phosphor layer 7 comprises a composition in which a blue light-emitting phosphor, a green light-emitting phosphor and a red light-emitting phosphor are dispersed in a glass material or a transparent resin such as epoxy resin or silicone resin. The red light-emitting phosphor is a deep red light-emitting magnesium fluorogermanate phosphor of the invention. There are no specific limitations with respect to the blue light-emitting phosphor and green light-emitting phosphor. Examples of the blue light-emitting phosphors include $(Ba,Sr,Ca)_3MgSi_2O_8$:Eu, $(Ba,Sr,Ca) MgAl_{10}O_{17}$:Eu and $(Ba, Sr, Mg, Ca)_{10}(PO_4)_6(Cl, F)_2$: Eu. Examples of the green light-emitting phosphors include $(Ca,Sr,Ba)_2SiO_4$: $Eu^{2+}$, $BaMgAl_{10}O_{17}$:$Eu^{2+}$, $Mn^{2+}$, α-SiALON:$Eu^{2+}$, β-SiALON:$Eu^{2+}$ and ZnS:Cu,Al.

The light-reflecting material 8 reflects a visible light emitted by the phosphor layer 7 towards outside, so as to increase the emission efficiency of the visible light. Examples of the light-reflecting materials include a resin material in which a metal powder of Al, Ni, Fe, Cr, Ti, Cu, Rh, Ag, Au or Pt, a white metal material such as alumina, zirconia, titania, magnesia, zinc oxide or calcium carbonate, and white pigments.

In the white light-emitting LED of FIGURE, an electric voltage is applied to the electrodes 4a,4b via the electroconductive wires 9a,9b. Upon the application of the electric voltage, the light-emitting semiconductor element 3 emits a light having a peak in the wavelength region of 350 to 430 nm. The emitted light excites the respective phosphors, whereby visible lights of blue color, green color and red color are produced. The produced lights of blue color, green color and red color are combined to give a white light.

The white light-emitting LED can be manufactured by way of the below-described procedures.

Electrodes 4a, 4b are formed on the substrate 1 according to the predetermined pattern. Subsequently, a light-emitting semiconductor element 3 is fixed onto the substrate 1 by the use of an adhesive 2. The semiconductor element 3 is electrically connected to the electrodes 4a,4b with lead wires 5a,5b which are formed, for example, by wire bonding. Thereafter, a light-reflecting material 8 is placed around the semiconductor element 3, and a transparent resin is spread on the semiconductor element 3. The transparent resin on the semiconductor element is then cured to form a resin layer 6. On the resin layer 6 are spread a resinous mixture of a transparent resin such as epoxy resin or silicone resin and the phosphors such as a blue light-emitting phosphor, a green light-emitting phosphor and a red light-emitting phosphor. The resinous mixture on the resin layer 6 is then cured to form a phosphor layer 7.

A red light-emitting LED can be manufactured by dispersing the deep red light-emitting magnesium fluorogermanate phosphor alone in the phosphor layer.

The white light-emitting LED may be manufactured by replacing the light-emitting semiconductor element 3 with a blue light-emitting semiconductor element and dispersing in the phosphor layer 7 a combination of the deep red light-emitting magnesium fluorogermanate phosphor and a green light-emitting phosphor. The blue light-emitting semiconductor element preferably is a semiconductor element which emits a blue light in the wavelength region of 440 to 480 nm upon application of electric energy.

EXAMPLES

Example 1

A fine magnesium oxide (MgO) powder having a BET specific surface area of 8 m$^2$/g and a purity of 99.98 wt. % (prepared by the gas phase procedure, comprising cubic primary particles in an amount of 90%), a magnesium fluoride (MgF$_2$) powder (BET specific surface area: 0.02 m$^2$/g, purity: 99 wt. %), a germanium oxide (GeO$_2$) powder (BET specific surface area: 0.06 m$^2$/g, purity: 99.9 wt. %), and a manganese carbonate (MnCO$_3$) powder (BET specific surface area: 0.06 m$^2$/g, purity: 99.9 wt. %) were so weighed as to give a molar ratio of 3.5:0.5:1:0.015 for MgO:MgF$_2$:GeO$_2$:MnCO$_3$. The weighed powders were placed in ethanol and mixed in a locking mill. The resulting mixture was dried at 120° C. for several hours, to obtain a starting powdery mixture. The starting powdery mixture was pulverized in a mortar, transferred in a alumina crucible, and calcined at 1,100° C. for 3 hours, to obtain a magnesium fluorogermanate phosphor having the formula of 3.5MgO.0.5AF$_2$.GeO$_2$:0.015Mn$^{4+}$. It was ascertained by the X-ray diffraction pattern and emission spectrum that the obtained magnesium fluorogermanate phosphor gives a maximum X-ray diffraction peak in the region of 35.2 to 36.0 degree in terms of the diffraction angle 2θ and a maximum emission peak in the wavelength region of 640 to 680 nm.

The X-ray diffraction pattern and emission spectrum were obtained under the below-mentioned conditions.

[X-ray Diffraction Pattern]

Measurement: continuous measurement

X-ray source: CuKα

Tube voltage: 40 kV

Tube current: 40 mA

Diverging slit width: ½ deg

Scattering slit width: ½ deg

Light receiving slit width: 0.30 mm

Scanning step: 2 deg/min.

Scanning step: 0.02 deg

[Emission Spectrum]

Ultraviolet rays of a wavelength of 400 nm emitted by Xe lamp were applied to the magnesium fluorogermanate phosphor sample to obtain emission spectrum of the phosphor.

Example 2

The procedures of Example 1 were repeated except that the starting powdery mixture in ethanol was processed in a ball mill, to obtain a magnesium fluorogermanate phosphor.

Example 3

The procedures of Example 1 were repeated except that the starting powdery mixture was calcined at 1,150° C. for 3 hours, to obtain a magnesium fluoro-germanate phosphor.

Example 4

The procedures of Example 1 were repeated except that the starting powdery mixture was calcined at 1,200° C. for 3 hours, to obtain a magnesium fluorogermanate phosphor.

Example 5

The procedures of Example 1 were repeated except that the starting powdery mixture in ethanol was processed in a ball mill and calcined at 1,200° C. for 3 hours, to obtain a magnesium fluorogermanate phosphor.

Comparison Example 1

The procedures of Example 1 were repeated except that a magnesium oxide powder was replaced with a magnesium oxide powder (BET specific surface area: 0.4 m$^2$/g, purity: 99 wt. %) obtained by calcination of magnesium hydroxide, to obtain a magnesium fluoro-germanate phosphor.

Comparison Example 2

The procedures of Example 1 were repeated except that a magnesium oxide powder was replaced with a magnesium oxide powder (BET specific surface area: 0.4 m$^2$/g, purity: 99 wt. %) obtained by calcination of magnesium hydroxide and the calcination of the starting powdery mixture was carried out at 1,200° C. for 3 hours, to obtain a magnesium fluorogermanate phosphor.

In Table 1 below, the mixing procedure for preparation of the starting powdery mixture, the conditions of calcination of the starting powdery mixture, and the strength of the maximum emission peak of the resulting deep red light-emitting magnesium fluorogermanate phosphor for each of Examples 1 to 5 and Comparison Examples 1 and 2. In Table 1, the strength of the maximum emission peak is shown as a relative value on the basis of the strength (shown as 100) of the maximum emission peak determined in Comparison Example 1.

For Comparison Example 1 and Example 5, addition, a ratio of the height of X-ray diffraction peak assigned to magnesium oxide to the height of X-ray diffraction peak assigned to the phosphor the magnesium in terms of a ratio of former to latter is shown.

TABLE 1

|  | Calcination Conditions | Emission Peak Strength (r.v.) | Ratio of X-ray Peak strength |
|---|---|---|---|
| Example 1 | 1100° C. × 3 hrs | 144 | Not measured |
| Example 2 | 1100° C. × 3 hrs | 166 | Not measured |
| Comp. Ex. 1 | 1100° C. × 3 hrs | 100 | 0.74 |
| Example 3 | 1150° C. × 3 hrs | 170 | Not measured |
| Example 4 | 1200° C. × 3 hrs | 172 | Not measured |

TABLE 1-continued

|  | Calcination Conditions | Emission Peak Strength (r.v.) | Ratio of X-ray Peak strength |
|---|---|---|---|
| Example 5 | 1200° C. × 3 hrs | 161 | 0.58 |
| Comp. Ex. 2 | 1200° C. × 3 hrs | 103 | Not measured |

Remarks:

Mixing means: Locking mill for Examples 1, 3 and 4, and for Comparison Examples 1 & 2. Ball mill for Examples 2 & 5

Examples 1-5: Fine magnesium oxide powder having a BET specific surface area of 8 m$^2$/g (prepared by a gas phase oxidizing procedure) was employed.

Comparison Examples 1 & 2: Magnesium oxide powder having a BET specific surface area of 0.4 m$^2$/g (prepared by calcination of magnesium hydroxide) was employed.

Example 6

The procedures of Example 1 were repeated except that a mixture of fine magnesium oxide powder, magnesium fluoride powder, germanium oxide powder and manganese carbonate powder was prepared in a molar ratio of 4.1:0.59:1:0.018 for $MgO:MgF_2:GeO_2:MnCO_3$ and that the calcination of the starting powdery mixture was carried out at 1,000° C. for 3 hours and then at 1,200° C. for 3 hours, to obtain a magnesium fluorogermanate phosphor having the formula of $4.1MgO.0.6Mg_2.GeO_2:0.018Mn^{4+}$. It was ascertained by X-ray diffraction pattern and emission spectrum that the obtained magnesium fluorogermanate phosphor gives a maximum X-ray diffraction peak in the region of 35.2 to 36.0 degree in terms of the diffraction angle 2θ and a maximum emission peak in the wavelength region of 640 to 680 nm.

The strength of the maximum emission peak was 147 as a relative value, calculated on the basis of the strength (as 100) of the maximum emission peak of the phosphor obtained in Comparison Example 1.

DESCRIPTIONS OF SYMBOLS

1: substrate, 2: adhesive, 3: light-emitting semiconductor element, 4a, 4b: electrode, 5a, 5b: lead wire, 6: resin layer, 7: phosphor layer, 8: light-reflecting material, 9a, 9b: electroconductive wire

What is claimed is:

1. A method for producing a deep red light-emitting magnesium fluorogermanate phosphor giving a light emission having a maximum peak in the wavelength region of 640-680 nm upon excitation with a light having a wavelength of 400 nm which comprises calcining a mixture comprising magnesium oxide, a fluorine compound, a germanium compound and a manganese compound, wherein the magnesium oxide is in the form of a fine powder having a BET specific surface area in the range of 5-200 m$^2$/g.

2. The method of claim 1 in which the magnesium oxide in the form of a fine powder comprises primary particles in the cubic form.

3. The method of claim 1 in which the magnesium oxide in the form of a fine powder has a purity of at least 99.9%.

* * * * *